(12) United States Patent
Wallmark

(10) Patent No.: US 6,359,451 B1
(45) Date of Patent: Mar. 19, 2002

(54) SYSTEM FOR CONTACTLESS TESTING OF PRINTED CIRCUIT BOARDS

(75) Inventor: Gerald N. Wallmark, Sandy Hook, CT (US)

(73) Assignee: Image Graphics Incorporated, Shelton, CT (US)

( * ) Notice: Subject to any disclaimer, the term of this patent is extended or adjusted under 35 U.S.C. 154(b) by 0 days.

(21) Appl. No.: 09/503,102

(22) Filed: Feb. 11, 2000

(51) Int. Cl.$^7$ .............................................. G01R 31/305
(52) U.S. Cl. ....................................................... 324/751
(58) Field of Search ............................... 324/751, 752, 324/754, 763, 765, 158.1; 250/397

(56) References Cited

U.S. PATENT DOCUMENTS

| | | |
|---|---|---|
| 3,531,716 A | 9/1970 | Tarui et al. |
| 3,549,999 A | 12/1970 | Norton |
| 3,628,012 A | 12/1971 | Stuart et al. |
| 3,646,344 A | 2/1972 | Plows et al. |
| 3,678,384 A | 7/1972 | Oatley |

(List continued on next page.)

Primary Examiner—Safet Metjahic
Assistant Examiner—J. Kerveros

(74) Attorney, Agent, or Firm—St. Onge Steward Johnston & Reens LLC

(57) ABSTRACT

A system for testing for opens in and shorts between conductor traces on a printed circuit board is provided. The system includes an electron gun assembly for generating an electron beam and an electron optics assembly for directing the electron beam to the traces on the surface of the board, the traces having a reference potential. A grid located proximate to and substantially parallel with the surface of the board is placed at a first potential before the electron beam is directed to a first point on a trace to charge the trace to a first potential. The grid is then placed at a second potential, the second potential being between the reference potential and the first potential, before the electron beam is directed to a second point on the trace to cause emission of secondary electrons. The secondary electrons that reach the grid are collected by the grid, and signal processing electronics and a CPU are used to determine whether or not an open or short exists depending on whether secondary electrons are collected by the grid as the electron beam is directed to various locations on the traces. The position and intensity of the electron beam are controlled by a raster/vector generator. In another aspect, the present invention provides a system having two electron gun assemblies and two grids, one of each placed on each side of a board so that traces on both sides of the board, or traces passing through the board, can be tested simultaneously.

70 Claims, 8 Drawing Sheets

U.S. PATENT DOCUMENTS

| | | |
|---|---|---|
| 3,763,425 A | 10/1973 | Engelke |
| 3,764,898 A | 10/1973 | Bohlen et al. |
| 3,796,947 A | 3/1974 | Harrod et al. |
| 4,169,244 A | 9/1979 | Plows |
| 4,220,853 A | 9/1980 | Feuerbaum et al. |
| 4,220,854 A | 9/1980 | Feurerbaum |
| 4,277,679 A | 7/1981 | Feurerbaum |
| 4,300,147 A | 11/1981 | Tarnowski |
| 4,415,851 A | 11/1983 | Langner et al. |
| 4,460,866 A | 7/1984 | Feuerbaum et al. |
| 4,514,682 A | 4/1985 | Feuerbaum |
| 4,554,455 A | 11/1985 | Todokoro et al. |
| 4,573,008 A | 2/1986 | Lischke |
| 4,575,630 A | 3/1986 | Lukianoff |
| 4,578,279 A | 3/1986 | Zingher |
| 4,712,057 A | 12/1987 | Pau |
| 4,801,879 A | 1/1989 | Spicer |
| 4,816,755 A | 3/1989 | Look et al. |
| 4,829,243 A | 5/1989 | Woodard, Sr. et al. |
| 4,843,329 A | 6/1989 | Beha et al. |
| 4,843,330 A | 6/1989 | Golladay et al. |
| 4,857,839 A | 8/1989 | Look et al. |
| 4,943,769 A | 7/1990 | Golladay et al. |
| 4,980,639 A | 12/1990 | Yoshizawa et al. |
| 4,985,681 A | 1/1991 | Brunner et al. |
| 5,017,863 A | 5/1991 | Mellitz |
| 5,057,773 A | 10/1991 | Golladay et al. |
| 5,093,616 A | 3/1992 | Seitoh et al. |
| 5,097,204 A | 3/1992 | Yoshizawa |
| 5,258,706 A | 11/1993 | Brunner et al. |
| 5,373,233 A | 12/1994 | Brunner et al. |
| 5,376,883 A | 12/1994 | Kaito |
| 5,404,110 A | 4/1995 | Golladay |
| 5,502,306 A | 3/1996 | Meisburger et al. |
| 5,521,517 A | 5/1996 | Shida et al. |
| 5,578,821 A | 11/1996 | Meisberger et al. |
| 5,602,489 A | 2/1997 | El-Kareh et al. |
| 5,606,261 A | 2/1997 | Golladay |
| 5,612,626 A | 3/1997 | Golladay |
| 5,614,833 A | 3/1997 | Golladay |
| 5,638,005 A | 6/1997 | Rajan et al. |
| 5,682,104 A | 10/1997 | Shido |
| 5,717,204 A | 2/1998 | Meisburger et al. |
| 5,781,017 A | 7/1998 | Cole, Jr. et al. |
| 5,804,980 A | 9/1998 | Nikawa |

SYSTEM FOR CONTACTLESS TESTING OF PRINTED CIRCUIT BOARDS

FIELD OF THE INVENTION

The present invention relates to a system for testing the networks of printed circuit boards without any physical contact therewith, and more particularly to a system and method of using an electron beam to test for shorts between and opens in conductor traces of a printed circuit board.

BACKGROUND OF THE INVENTION

It is desirable in the manufacture of printed circuit boards to test for defects at an early stage of fabrication in order to minimize the costs of repairing such defects and to maximize the yield of operable devices. The traditional approach to testing such circuitry has been to use mechanical devices, such as pins or other mechanical probes, to contact points on the circuitry to be tested and to run a current therethrough. However, the small size and high density of modern printed circuit boards makes the use of such mechanical testing devices unfeasible. The networks of modern printed circuit boards are becoming so small and so compactly placed on the boards that using a mechanical probe is difficult, if not impossible. Moreover, as the networks become smaller, the risks associated with damaging the networks using mechanical probes increases. For these reasons, systems using electron beams to provide contactless testing have been developed. However, although such systems exist, these known systems suffer from a number of disadvantages.

U.S. Pat. No. 4,843,330 to Golladay et al. discloses an electron beam contactless testing system which includes a conductive grid 48 placed above the surface of the specimen 36 to be tested. The 48 grid is negatively biased while the networks to be tested are charged in order to repel secondary electrons back toward the specimen and enhance charging of the conductive material. The bias is removed, or a positive bias is applied, during scanning of the specimen by a beam 12 so that secondary electrons can be collected by a detector. The testing system also includes a table 32 selectively movable in the X-Y directions perpendicular to the axis of beam 12 to position specimen 36 within the beam deflection field.

U.S. Pat. No. 5,602,489 to El-Kareh et al. discloses a method for testing the interconnect networks of a multichip module for opens and shorts. An electron beam 570 lands on a pad of an interconnect network located on a substrate 500. The electron beam 570 is used to interrogate the pad. An extract grid 550 located above the substrate is maintained at a positive potential. While the electron beam 570 interrogates the pad, the pad emits secondary electrons until such a point that the pad reaches a positive potential near that of the positive potential of the extract grid 550. The extract grid is then switched to a negative potential. The pad, still being interrogated by the electron beam 570, then collects secondary electrons until such a point that the pad reaches a negative potential near that of the negative potential of the extract grid 550. The test time, the length of time it takes for the pad to change from the positive potential to the negative potential, is measured and compared to a reference value. From this comparison it can be determined whether the interconnect network is defect-free, open, or shorted. The increase or decrease in emitted secondary electrons are evaluated by an electron detector 560, and the substrate 500 is moved relative to the electron beam 570 by an x-y stage 540.

U.S. Pat. No. 4,169,244 to Plows discloses a system for testing electronic networks. The system includes an electron gun 2 for production of an electron probe 1, a scanning control for probe 1, and a holder 16 capable of supporting a specimen 25 such that the probe 1 can impinge substantially normally on the specimen 25. Deflection coils 6 are used to direct electron probe 1 to varying locations on the specimen 25.

All of these prior art patents disclose devices which use a focused electron beam, such as that generated by a scanning electron microscope. Such a beam is capable of charging/reading a small area, for example an area of 1 inch by 1 inch. When a larger board, or a panel of small boards, is to be tested it is therefore necessary to move the board (as does the X-Y table of Golladay et al. and the x-y stage of El-Kareh et al.). Moving the board, however, can greatly increase the time necessary for testing, particularly when numerous points on the board must be tested.

Moreover, all prior are references disclose systems which can perform only top-to-top testing of board networks. If the network passes through the board, the network cannot be charged at a point on one side of the board and then tested at a point on the other side of the board. This is a serious disadvantage, as many modern circuit boards have networks which pass therethrough.

Furthermore, the systems disclosed in all prior art patents require that secondary electrons emitted by the networks being tested be collected by a discrete electron detector. Such systems are prone to error, however, as emitted electrons may not necessarily be deflected toward the detector, and may therefore not be detected.

A further disadvantage with respect to El-Kareh et al. is that the test time, that is, the length of time it takes for the pad to change from the positive potential to the negative potential, must be measured and compared to a reference value for every pad tested. Depending on the materials used and the size of the pads, this test time may be great, thereby greatly increasing the time necessary for testing a board.

What is desired, therefore, is a system for testing printed circuit boards which tests the networks of printed circuit boards without any physical contact therewith, which quickly tests numerous points on the boards, which can test large boards or panels of small boards without requiring movement of the boards, which tests networks passing through the boards, and which reliably detects the presence of emitted secondary electrons.

SUMMARY OF THE INVENTION

Accordingly, it is an object of the present invention to provide a system for testing printed circuit boards which employs electron beams to test the networks of printed circuit boards without any physical contact therewith.

Another object of the present invention is to provide a system for testing printed circuit boards which quickly tests numerous points on the boards.

A further object of the present invention is to provide a system for testing printed circuit boards which employs an electron beam such that large boards and panels of small boards can be tested without requiring movement of the boards.

Still another object of the present invention is to provide a system for testing printed circuit boards which tests networks passing through the boards.

Still a further object of the present invention is to provide a system for testing printed circuit boards which tests both sides of printed circuit boards using an electron beam on each side.

Yet a further object of the present invention is to provide a system for testing printed circuit boards which reliably detects the presence of emitted secondary electrons.

These and other objects of the present invention are achieved by provision of a system for testing for opens in and shorts between conductor traces on a surface of a printed circuit board. The system includes an electron gun assembly for generating an electron beam and an electron optics assembly for directing the electron beam to the conductor traces on the surface of the printed circuit board, which conductor traces are at a reference potential. A grid located proximate to and substantially parallel with the surface of the printed circuit board is placed at a first potential before the electron beam is directed to a first point on a conductor trace to charge the conductor trace to a first potential. The grid is then placed at a second potential, the second potential being between the reference voltage and the first potential, before the electron beam is directed to a second point on the conductor trace to cause emission of secondary electrons. Any secondary electrons that reach the grid are collected by the grid, and a CPU is used to determine whether or not an open or short exists depending on whether secondary electrons are collected by the grid as the electron beam is directed to various locations on the conductor traces. The position and intensity of the electron beam are controlled by a raster/vector generator.

The electron optics assembly includes a focus coil having static and dynamic windings to focus the electron beam anywhere across the surface of the printed circuit board, at least one beam alignment yoke to position the electron beam precisely along the magnetic axis of the focus coil, a deflection yoke to produce magnetic fields that precisely position the electron beam anywhere across the surface of the printed circuit board, and an astigmatism corrector to compensate for any residual astigmatism caused by the focus coil and for any deflection astigmatism caused by the deflection yoke. The electron optics assembly also includes a static focus control for controlling the static winding of the focus coil and a dynamic focus driver for controlling the dynamic windings of the focus coil to adjust the focus of the electron beam for changes in focal length as the electron beam is deflected over the surface of the printed circuit board. A dynamic astigmatism correction generator is provided for controlling the astigmatism corrector to correct for spot distortions as the electron beam is deflected away from a center of the printed circuit board, and a geometric correction generator is provided for controlling the deflection yoke to correct for positional distortions as the electron beam is deflected away from a center of the printed circuit board.

Preferably, the electron gun assembly is surrounded by a gun chamber, the electron optics assembly is surrounded by an electron optics chamber and the printed circuit board is surrounded by a test chamber, and the system includes a vacuum system. The vacuum system creates a vacuum in the test chamber, a vacuum in the electron optics chamber greater than the vacuum in the test chamber, and a vacuum in the gun chamber greater than the vacuum in the electron optics chamber.

Also preferably, the system utilizes a spot analyzer for adjusting focus, astigmatism and geometry of the electron beam, and for measuring the spot size of the electron beam. The spot analyzer includes a target plate having a plurality of polygonal apertures on the face. A plurality of sensors are positioned inside the target plate under the plurality of polygonal apertures. The signals from the sensors are indicative of the quality of an electron beam striking the polygonal aperture above each sensor. Beam control signals are provided by the raster/vector generator for directing the beam to strike the apertures above the sensors. Signal processing electronics are also provided for amplifying, filtering, and performing analog-to-digital conversion of the signals generated by the sensors and for generating processed signals, which can be used by computational software executing the CPU to adjust the electron optics assembly.

In another aspect, the target plate can contain a plurality of polygonal apertures on two opposing faces with the plurality of sensors designed to receive signals from the plurality of sensors on both faces. Such a configuration will permit aligning of two sets of electron optics in a two-sided, dual beam testing system.

Most preferably, each surface of the printed circuit board includes at least two fiducial marks thereon. Software executing on the CPU aligns the deflection axes of each of the electron optics assemblies with respect to each surface of the printed circuit board based upon secondary electron signals generated by the fiducial mark(s).

In another aspect, the present invention provides a system having two electron gun assemblies, two electron optics assemblies and two grids, one of each placed on each side of a printed circuit board having two faces so that traces on both sides of the board, or traces passing through the board, can be tested simultaneously.

The invention and its particular features and advantages will become more apparent from the following detailed description considered with reference to the accompanying drawings.

DETAILED DESCRIPTION OF THE INVENTION

Figure 1:
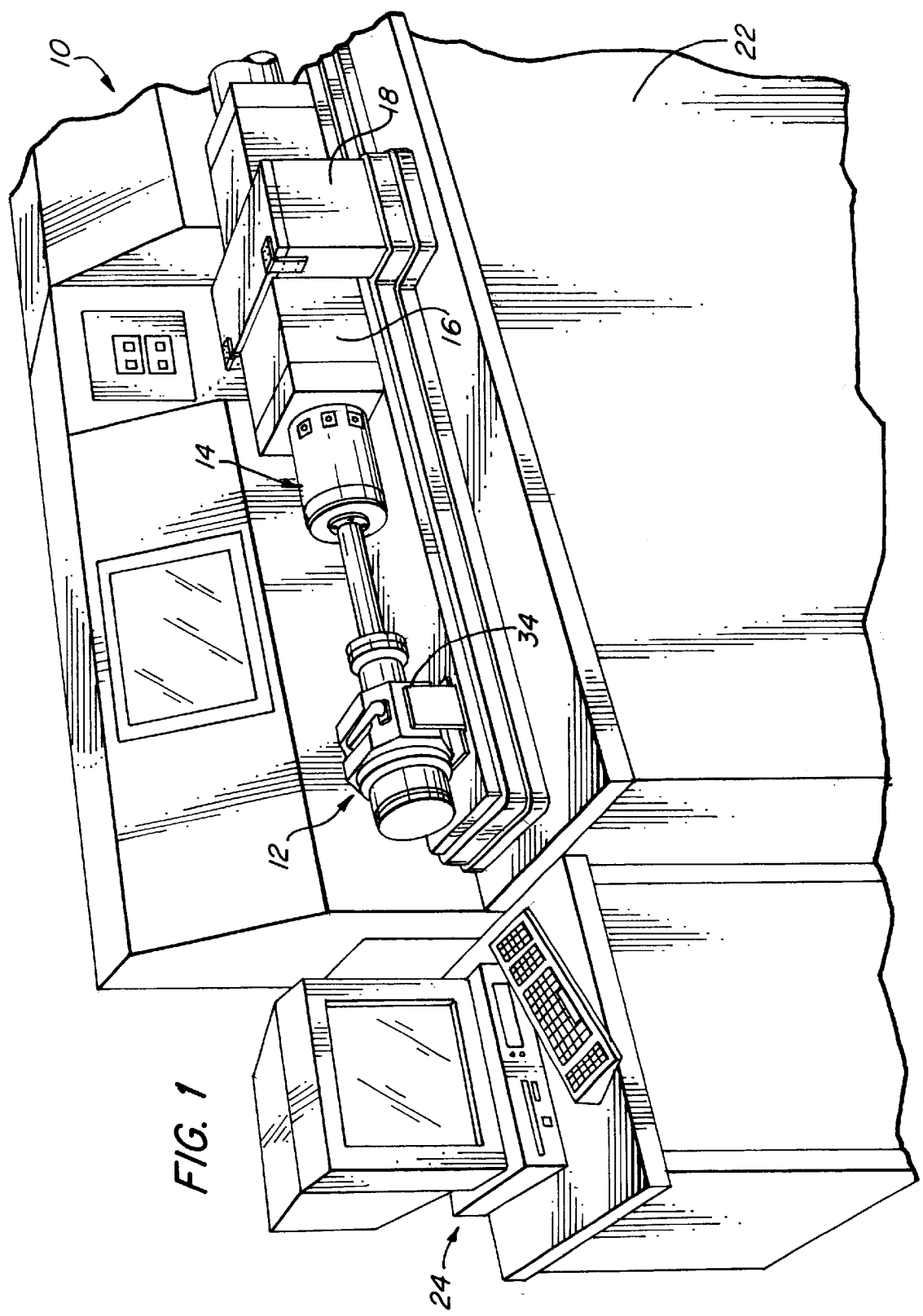
FIG. 1 is a side isometric view of a portion of a system for testing for opens in and shorts between conductor traces on a surface of a printed circuit board in accordance with the present invention.
Figure 2:
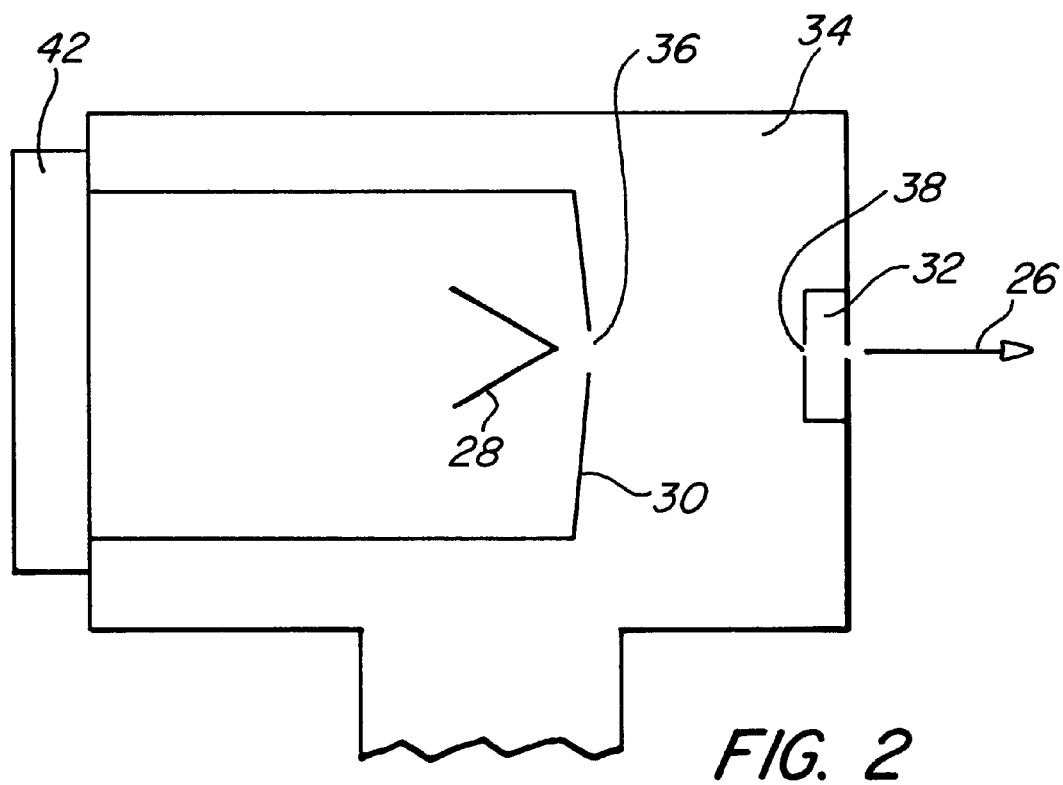
FIG. 2 is a schematic view of an electron gun assembly which may be used in the system of FIG. 1.
Figure 3:
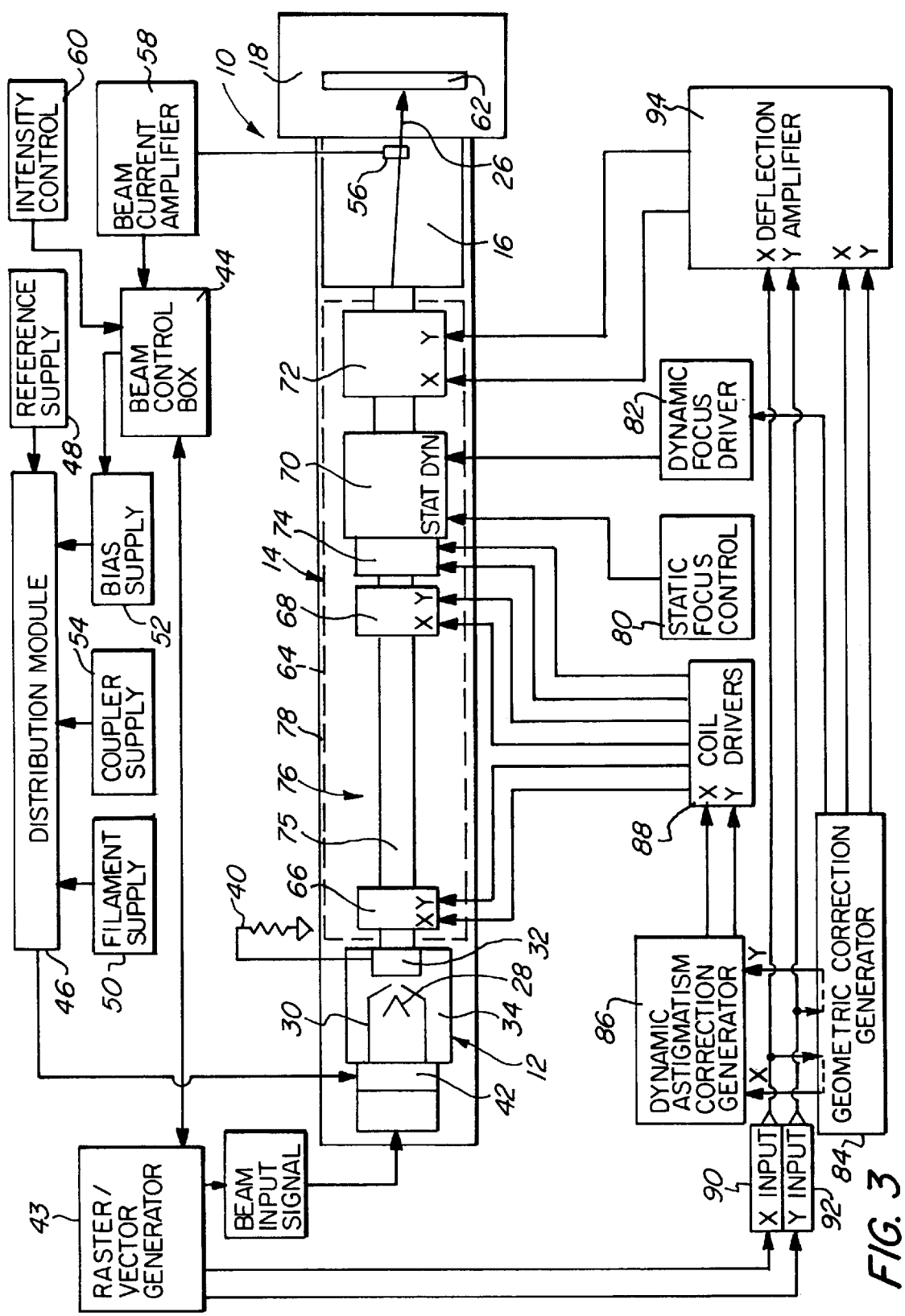
FIG. 3 is a schematic view of the system of FIG. 1.
Figure 4:
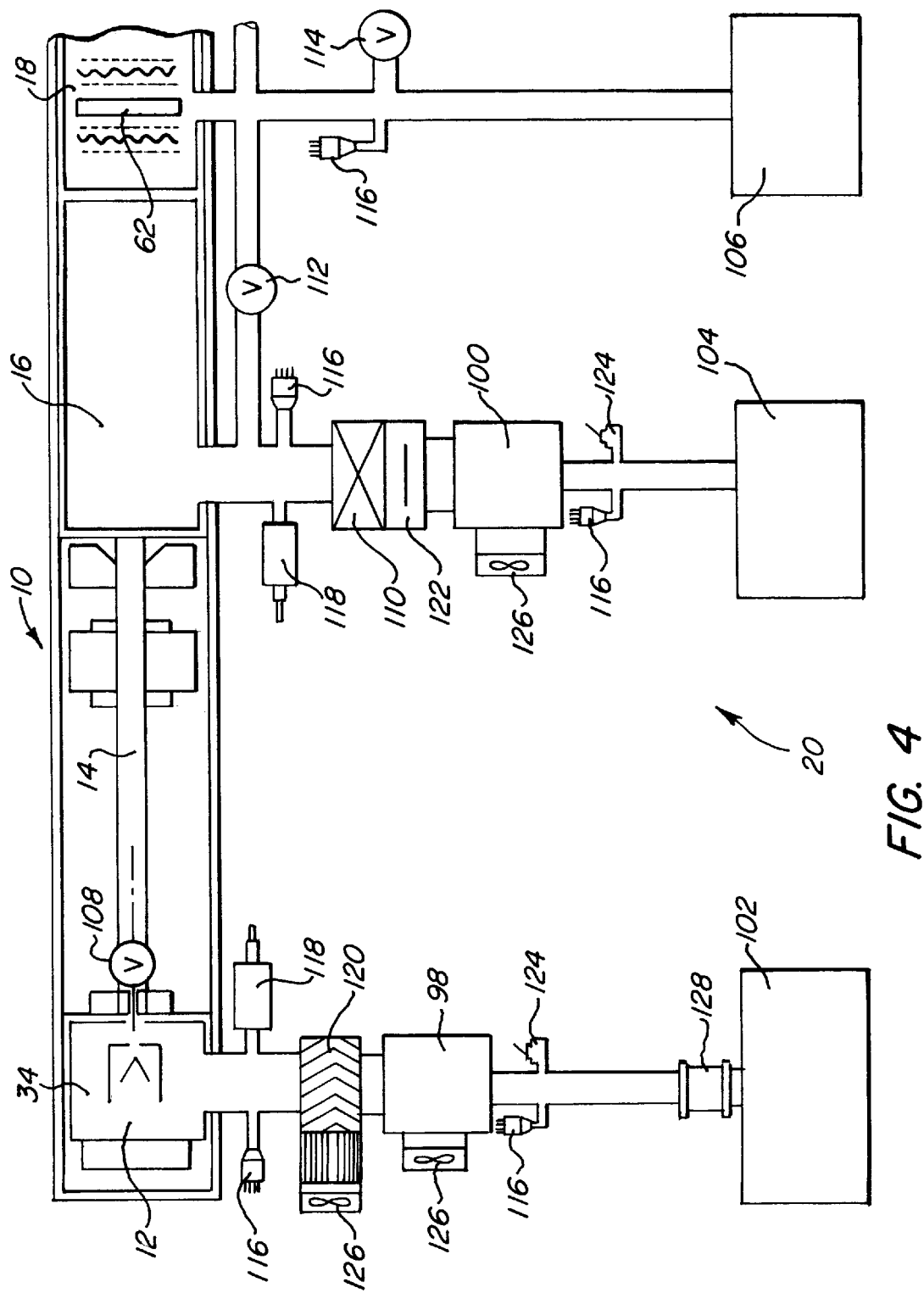
FIG. 4 is a schematic view of a vacuum system which may be used in the system of FIG. 1.
Figure 5:
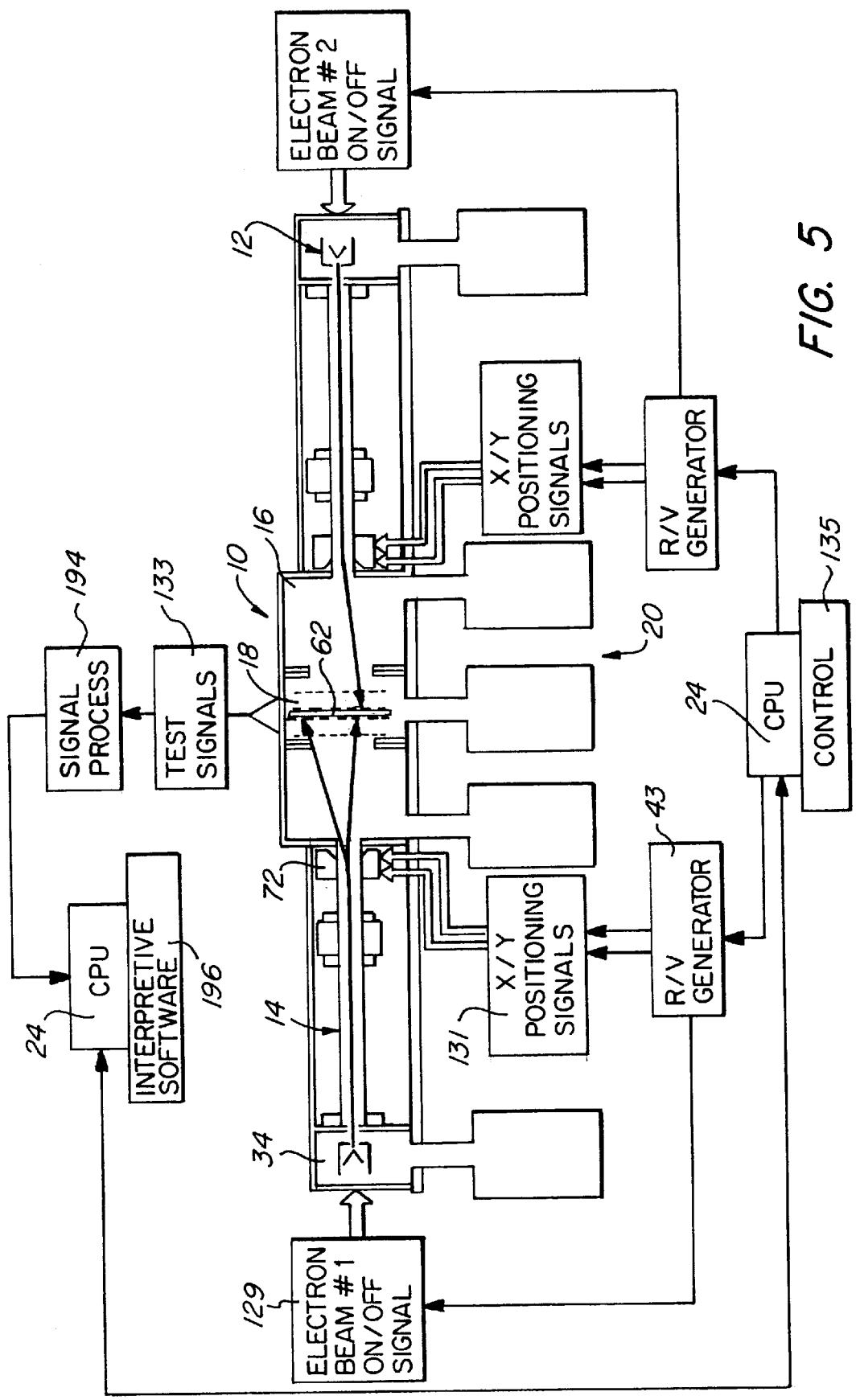
FIG. 5 is a schematic view of a dual beam system that can test both sides of a printed circuit board simultaneously.

Referring first to FIGS. 1–5, a system 10 for contactless testing of printed circuit boards in accordance with the present invention is shown. System 10 includes an electron gun assembly 12, an electron optics assembly 14, an electron optics chamber 16, and a test chamber 18. It should be noted that system 10 preferably includes two electron gun assemblies 12, two electron optics assemblies 14 and two electron optics chambers 16, as shown in FIG. 5. However, only one of each is shown in FIGS. 1 and 3 for the sake of simplicity. The description below refers to such a dual-beam system, although a single-beam system is also contemplated. System 10 also includes a vacuum system 20 (shown best in FIG. 4) located within a housing 22. A central processing unit (CPU) 24 is also provided to control various operations of system 10 as discussed more fully below.

Referring now to FIGS. 2 and 3, electron gun assemblies 12 are used to generate electron beams (indicated by arrows 26), and generally include three components: a filament 28, a gun grid 30 and an anode 32 located within a gun chamber 34. The filament 28, or cathode, is heated by passing a DC current, supplied by a DC power supply (discussed below), through it. This current frees some of the electrons on the surface of filament 28. The free electrons are accelerated toward anode 32 by an electrostatic field produced by a difference in potential between filament 28 and the anode 32. The gun grid 30, which is placed between filament 28 and anode 32, but much closer to filament 28, is connected to a slightly more negative potential than filament 28. A hole 36 in the center of gun grid 30 permits electrons to pass from filament 28 to anode 32. The electrostatic field produced by the difference in potential between gun grid 30 and filament 28 opposes the field provided between filament 28 and anode 32. This field repels some of the electrons emitted from filament 28 and prevents them from passing through hole 36 in gun grid 30 toward anode 32. By varying the voltage applied to gun grid 30, the electron stream from filament 28 to anode 32 can be increased, decreased or turned off completely.

The electrons that pass through hole 36 in gun grid 30 strike anode 32. An extremely small aperture 38 in anode 32 allows some of the electrons to pass therethrough, forming electron beam 26. The electrons striking anode 32, but not passing through aperture 38, are returned to ground potential through an anode termination assembly 40 since anode 32 is isolated from ground inside gun chamber 34. A coupler 42 receives an intensity signal from a raster/vector generator 43 and couples it to gun grid 30, which is referenced at a reference voltage, in order to control gun grid 30 to modulated the intensity of electron beam 26. Raster/vector generator 43, with its software, controls the position and intensity of electron beams 26. In addition to accurately positioning electron beams 26, it can scan electron beams 26 in selected raster formats as well as in selected vector formats. Raster/vector generator 43 can preferably provide 65K by 65K addressability, up to 4096 beam intensity levels, and size selectable rasters and subrasters. All capabilities of raster/vector generator 43 are under software control, which may or may not be executing on CPU 24.

The power for electron gun assemblies 12 is provided by four power supplies which flow through a distribution module 46. Reference voltage power supply 48 provides the accelerating potential for the electron beam, which typically ranges from −500 volts to −1000 volts, while filament power supply 50, which is referenced to reference power supply 48, provides the current for heating filament 28. Bias power supply 52 provides a DC control potential to gun grid 30. The isolated output voltage of bias power supply 52, referenced to reference power supply 48, is controlled by the program input by a voltage from raster/vector generator 43. The beam intensity signals provided by coupler 42 are added to the voltage produced by bias power supply 52 to modulate electron beam 26. Coupler power supply 54 provides power to coupler 42, and is also referenced to reference power supply 48.

Exposure control and compensation are used in system 10 to adjust for any electron beam intensity drift over time. Compensation is accomplished by automatic measurement of the electron beam 26 current and automatic adjustment of bias power supply 52 voltage by a beam control box 44. When the compensation aspect of raster/vector generator beam control box 44 is activated, electron beam 26 is deflected to a beam measurement electrode 56 in electron optics chamber 16, where it is collected and sent to a beam current amplifier 58. The output voltage from beam current amplifier 58 is compared in beam control box 44 with a reference voltage from raster/vector generator 43, and the output voltage of beam control box 44, which controls bias power supply 52, is automatically adjusted until the level of electron beam 26 current corresponds to the reference voltage. The electron beam 26 current is sampled periodically and compared to the reference value from raster/vector generator 43. The program voltage from beam control box 44 to the bias power supply 52 is automatically adjusted to maintain a consistent level of electron beam 26 current. The reference voltage in beam control box 44 module can also be controlled by an intensity control 60, allowing different levels of intensity to be set.

The electrons from electron gun assemblies 12 leave anode apertures 38 as slowly diverging beams that travel down drift tubes 75 and are then focused and positioned onto the printed circuit board 62 by electron optics assemblies 14. Each of electron optics assemblies 14 consists of five high precision coils 64 for controlling electron beam alignment, focus, position, shape and size; magnetic shielding to eliminate interference by external magnetic fields; and various circuit modules to provide signals to control and drive the electron optic coils. Electron optic coils 64 consist of the following: two alignment yokes 66, 68; a high resolution static and dynamic focus coil 70; a high performance deflection yoke 72; and an astigmatism corrector 74. Since all geometric image distortions, for example pin cushioning, are corrected electronically, no geometric correction coils or magnets are required.

Two beam alignment yokes 66, 68 are used to position electron beam 26 precisely along the electromagnetic axis of focus coil 70. One beam alignment yoke 66 is mounted directly in front of the anode aperture 38, while the second beam alignment yoke 68 is mounted on the end of a coil housing assembly 76. By adjusting the X and Y currents in both yokes, electron beam 26 can be precisely aligned with the magnetic field of focus coil 70, with no mechanical adjustment of focus coil 70 required. A single gap static and dynamic focus coil 70 is used in system 10. It is precisely located and fit into coil housing assembly 76 to minimize the electrical adjustments required to align electron beam 26 to its magnetic axis. No mechanical adjustments of focus coil 70 are required. Electron beam 26 is focused at the center of the test format by the sum of the fields produced by the currents through the static and dynamic windings of focus coil 70. The current through the static winding is a very stable constant current. The current through the dynamic winding is dynamically adjusted to refocus electron beam 26 as it is deflected toward the edges and corners of the test format.

Deflection yoke 72 produces the magnetic fields that precisely position electron beam 26 across the entire test format. It uses a ferrite core design to provide an anastigmatic field and to eliminate higher order beam distortions. A coil winding configuration provides complete symmetry between deflection axes. Consequently, using dynamic focus modulation, uniform focus over the entire test format can be achieved. An astigmatism corrector 74 is used to compensate for the residual astigmatism of focus coil 70 and the deflection astigmatism produced by deflection yoke 72. It consists of two coils wound on a common annular core. In order not to produce a component of deflection, astigmatism corrector 74 is precisely aligned to the center of the electron optical axis. Electron beam astigmatism is corrected at the center of the test format for astigmatism due to focus coil 70 and then is dynamically adjusted to correct the beam shape as it is deflected toward the edges and corners of the test format.

The entire electron beam 26 path, from electron gun assemblies 12 to printed circuit board 62 is shielded from the interference of magnetic fields emanating from other nearby components by a two-layer magnetic shield 78 made of high permeability material.

A number of electron optics circuits supply the drive currents for the electron optic coils 64 to provide beam alignment, focus, deflection, and astigmatism correction. They also generate signals for the dynamic correction of focus, astigmatism, and geometric distortions. A static focus control 80 provides constant current to the static winding of the focus coil 70, while a dynamic focus driver 82 provides drive current for the dynamic winding of the focus coil 70. The dynamic focus correction signal generated on a geometric correction generator 84 is used to adjust the focus, necessitated by a change in focal length as electron beam 26 is deflected over its full format. A dynamic astigmatism correction generator 86 generates signals used to correct for spot distortions as electron beam 26 is deflected away from the center of the test format. The signals generated by dynamic astigmatism corrector 86 are sent to the astigmatism coil driver, of coil drivers 88, which use the signals to control astigmatism corrector 74.

Geometric correction generator 84 generates the signals used to correct for distortions as electron beam 26 is deflected away from the center of the test format. The correction signals are summed with the main X deflection signal 90 and Y deflection signal 92 (which are the signals passed to geometric correction generator 84 and dynamic astigmatism corrector 86) in a deflection amplifier 94. The X deflection signal 90 and Y deflection signal 92 are supplied by raster/vector generator 43. The geometric correction generator generates, as a minimum, correction signals for X/Y radial linearity, X/Y pincushion, X/Y edge bow, X/Y differential linearity, X/Y bow, X skew, Y rotation, X/Y trapezoidal, X/Y edge rotation, X/Y 5th order correction and X/Y 7th order correction. Deflection amplifier 94 receives X deflection signal 90 and Y deflection signal 92 as well as signals from geometric correction generator 84 and provides the drive currents for X and Y beam positioning across the test format. When the compensation aspect of automatic beam control 44 and electron beam current is sampled for control of the beam intensity level, signals to deflection amplifier 94 deflect electron beam 26 to beam measurement electrode 56.

Electron gun assemblies 12, when coupled with electron optics assemblies 14, thus provide high speed and precision X, Y and Z (intensity) control of electron beam 26. Electron gun assemblies 12 generate electron beams 26 and vary their intensity according to a control signal from raster/vector generator 43. Electron optics assemblies 14 shape electron beams 26 (focus and astigmatism) and deflect the beams (X and Y) according to signals from raster/vector generator 43. Focus, deflection, and astigmatism signals are dynamically adjusted to provide a well defined and accurately positioned spot over the entire format.

Referring now to FIG. 4, system 10 incorporates a vacuum system 20 to ensure for proper operation of electron gun assemblies 12 and formation of a finely focused electron beam 26. Unlike traditional cathode ray tube (CRT) devices, which are sealed tubes that will maintain a vacuum indefinitely, system 10 requires that the 'tube" be opened to the atmosphere to load and unload printed circuit boards 62 to be tested. Alternatively, a load/unload chamber can be added to system 10. Such a chamber can house either a single board at a time or multiple boards that can then be fed into and out of the test chamber 18. With the load/unload chamber, test chamber 18 and electron optics chambers 16 can remain under the test level vacuums and only the load/unload chamber cycles from atmosphere to vacuum.

Vacuum system 20, is a dual, fully automatic, three stage differentially pumped system that allows rapid access to printed circuit boards 62 and fast pump-down after loading, while maintaining the high vacuum required for long operational life of electron gun assemblies 12. Vacuum system 20 consists of five vacuum chambers, vacuum pumps to maintain the proper vacuum in each of the chambers, vacuum valves to control the pump-down and venting of the system and provide ease of maintenance and failsafe operation, vacuum gauges to measure the vacuum in the various sections of the system 10, and a vacuum control unit to monitor the output of the gauges and control the sequence of valve operation. Power for vacuum system 20 components is controlled by a power control unit. The warm-up time for vacuum system 20, from a cold start to operational vacuum, is less than one hour. The pump-down time for test chamber 18 is less than one minute.

Vacuum system 20 is divided into five vacuum chambers. They consist of two electron gun chambers 34, two electron optics chambers 16, and one test chamber 18. It should be noted that only one of each of electron gun chambers 34 and electron optics chambers 16 is shown in FIG. 4 for the sake of simplicity. Those not shown are essentially arranged in a mirror-image to those which are shown. Each type of chamber is maintained at a different pressure (differentially pumped) during operation. Electron gun chambers 34 are operated at very high vacuum at all times to prolong the life of electron gun assemblies 12. During testing of a printed circuit board 62, electron optics chambers 16 are maintained at a slightly higher pressure (less vacuum) than gun chambers 34, and test chamber 18 is at a slightly higher pressure than electron optics chambers 16 with controlled leakage from one chamber to the next. Typically, electron gun chambers 34 are operated at $10^{-7}$ Torr, electron optics chambers 16 at $10^{-4}$ Torr and test chamber 18 at 100 millitorr. Alternatively, if a load/unload chamber is part of the system that chamber is also operated at 100 millitorr. During loading of a printed circuit board 62, gun chambers 34 can be sealed from the other chambers and electron optics chambers 16 and test chamber 18 can be vented (air let in) to allow access to test chamber 18.

In order to maintain a different level of vacuum in each of the chambers, five separate pumping systems are used. Because gun chambers 34 and electron optics chambers 16 require a higher vacuum than test chamber 18, each use an oil diffusion pump 98, 100 backed by a mechanical pump 102, 104. Test chamber 18 (and load/unload chamber, if used) vacuum is achieved by using a mechanical pump 106 only. Test chamber mechanical pump 106 is also used during the start of vacuum system 20 pump-down to evacuate electron optics chambers 16 to a level where the electron optics chambers' diffusion pumps 100 can operate.

The sequencing of the vacuum system from atmospheric pressure to operational vacuum is accomplished by the use of electromechanical vacuum valves. Initially, gun ball valves 108 seal gun chambers 34 from electron optics chambers 16 and test chamber 18. Gun chambers 34 are under vacuum from diffusion pumps 98, while test chamber 18 and electron optics chambers 16 are at atmospheric pressure. High vacuum butterfly valves 110 seal electron optics chambers 16 from their diffusion pumps 100. Roughing ball valves 112 are open, providing a high conductance path between electron optics chambers 16 and test chamber 18, and solenoid vent valve 114 is open. When test chamber vacuum is switched on test chamber mechanical pump 106 starts, vent valve 114 closes and both test chamber 18 and electron optics chambers 16 are pumped down together until a preset pressure is reached in electron optics chambers 16. At this time, roughing valves 112 close and high vacuum butterfly valves 110 open allowing electron optics chamber diffusion pumps 100 to evacuate electron optics chambers 16 to a lower pressure than test chamber 18. When operational vacuum is achieved in all three chambers, gun valves 108 open, completing the cycle. Gun valves 108 will close automatically if any of the chambers rise above operating pressure.

Sequencing from operational vacuum to atmospheric pressure is accomplished by switching off the test chamber vacuum. Test chamber mechanical pump 106 stops, gun valves 108 close, high vacuum butterfly valves 110 close, roughing valves 112 open, vent valve 114 opens and air is let into test chamber 18 and electron optics chambers 16 to allow access to printed circuit board 62. Vent valve 114 provides failsafe operation in that it is normally closed and must be energized to open.

Two types of vacuum gauges are used in vacuum system 20. Thermocouple gauges 116 are provided for sensing the vacuum at low vacuum levels and cold cathode ionization gauges 118 are provided for sensing the vacuum at high vacuum levels. Thermoelectric baffles 120 are provided between diffusion pumps 98 and gun chambers 34 and ambient baffles 122 are provided between diffusion pumps 100 and electron optics chambers 16 to condense hot diffusion pump oil and thereby prevent oil backstreaming to gun chambers 34 and electron optics chambers 16. Manual vent valves 124 located between diffusion pumps 98 and mechanical pumps 102 and between diffusion pumps 100 and mechanical pumps 104 can be used to vent the vacuum therebetween. Fans 126 are provided for diffusion pumps 98, 100 and thermoelectric baffle 120 to provide cooling, and traps 128 are provided between diffusion pumps 98 and mechanical pumps 102 to prevent fouling of delicate instruments.

Referring now to FIG. 5, the preferable configuration for system 10 is shown. This configuration includes two electron gun assemblies 12 inside two gun chambers 34, two electron optics assemblies 14, two electron optics chambers 161 and a test chamber 18. Two raster/vector generators 43 provide the control signals 129 to the two electron guns 12 and the deflection signals 131 to the two deflection yokes 72. Raster/vector generators 43 are in turn controlled by control software 135 executing on CPU 24. Vacuum system 20 generates the required vacuum environment of all the chambers in the system. Signals 133 from the two sides of printed circuit board 62 are fed into signal processing electronics 194. The processed signals are then sent to CPU 24. Interpretive software 196 which resides on CPU 24 is then used to determine whether any shorts or opens are present on printed circuit board 62. System 10 in this configuration can tests both sides of a printed circuit board simultaneously.

Figure 7:
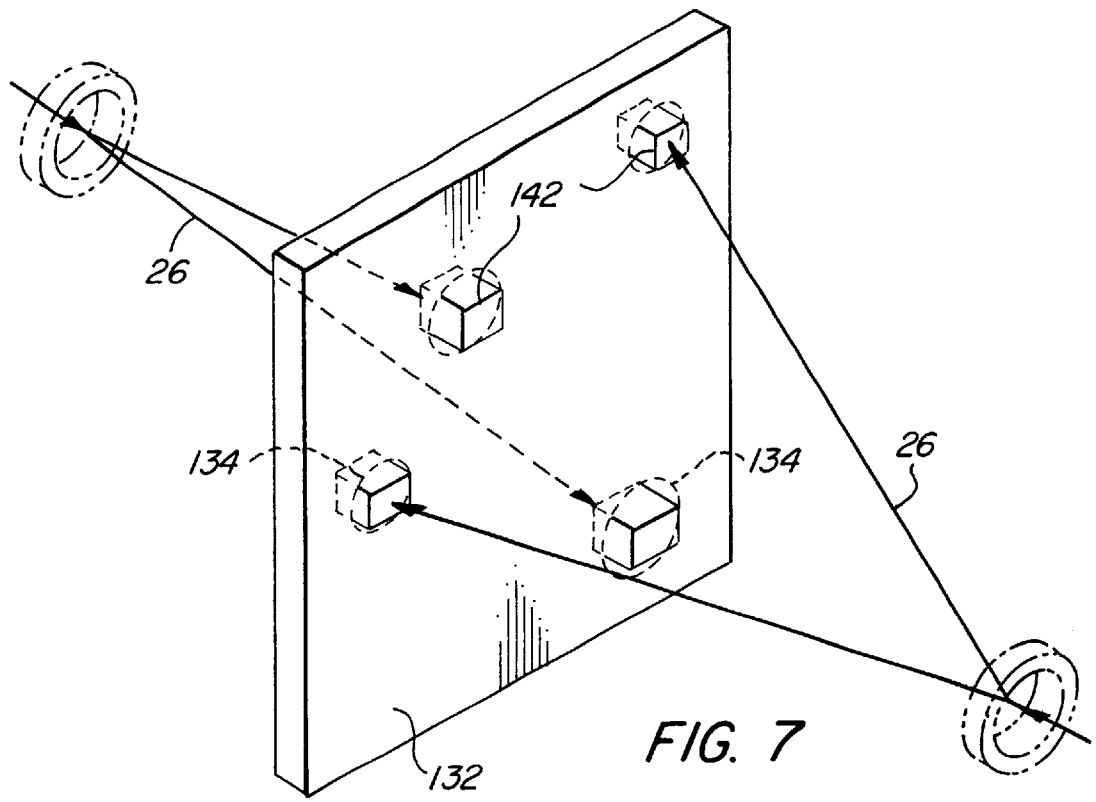
FIG. 7 is a side isometric view of a portion of the spot analyzer of FIG. 6.
Figure 6:
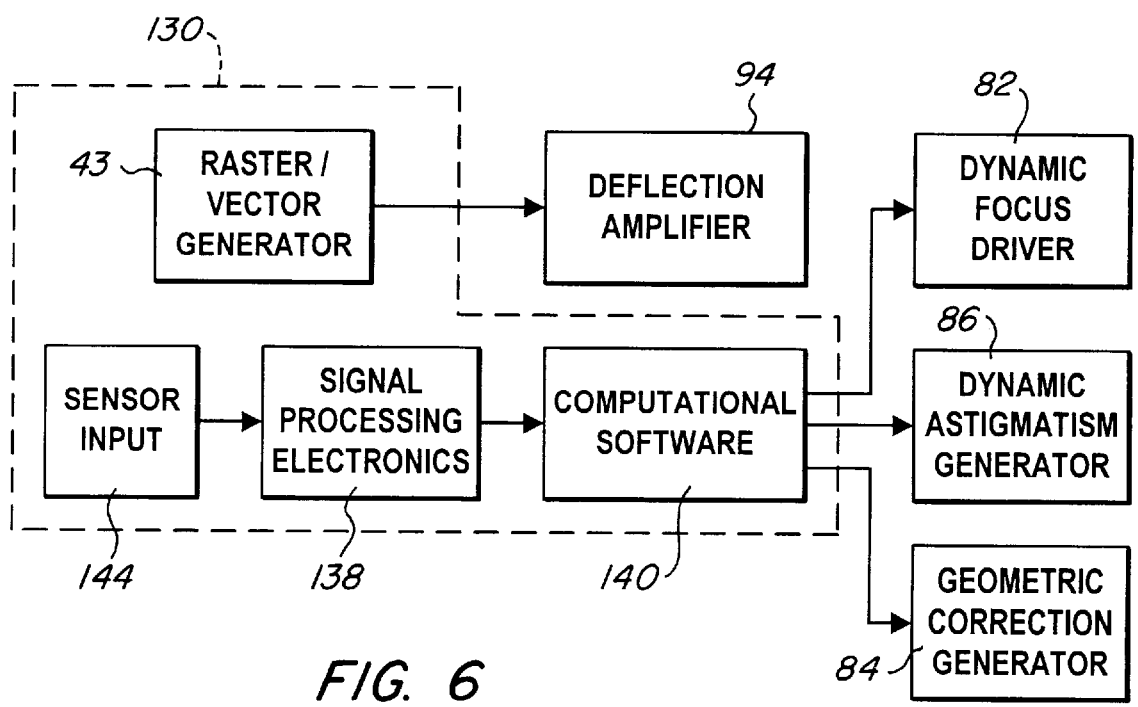
FIG. 6 is a block diagram of a spot analyzer which may be used with the system of FIG. 1.

Referring now to FIGS. 6 and 7, system 10 preferably includes a spot analyzer 130, which is a diagnostic tool that permits setup of electron optical systems 16 of system 10. Specifically, spot analyzer 130 is designed to permit the following: alignment of focus coils 70, adjustment of static focus, dynamic focus, dynamic astigmatism and geometry, and measurement of the spot size of electron beams 26. Spot analyzer 130 includes a target plate 132 having sensors 134 mounted thereon, signal processing electronics 138, and computational software 140.

When spot analyzer 130 is to be used, target plate 132 is mounted at the test plane of system 10 in place of printed circuit board 62. Target plate 132 contains a plurality of apertures 142 on each face, each of the apertures having a polygon shape. These apertures 142 are placed at selected locations over the printed circuit board test format. Target plate 132 includes a set of sensors 134. These sensors 134 are placed inside the target plate 132 between the two sets of apertures 142. The sensors 134 are underneath the apertures 142, thereby requiring that the electron beams 26 pass through apertures 142 before being measures. Each set of sensors 134 is used to establish and verify geometric correction. In addition, a subset of these sensors 134 is used to establish and verify peak focus and minimum astigmatism over the entire test format. Peak focus is established by observing the slope of the output waveform as electron beam 26 scans across the target edge and maximizing the "steepness" of the slope of this waveform. Similarly, astigmatism is minimized by scanning each target in a ray burst pattern and adjusting astigmatism corrector 74 until the slopes of all the waveforms resulting from the ray burst scan are the same.

Beam control signals are provided by the raster/vector generator 43. These signals consist of beam positioning signals and sweep signals. The beam positioning signals are X and Y deflection voltages when are fed to the deflection amplifier 94 of system 10 so that electron beam 26 can be positioned to any one of the aperture locations. Beam positional signals permit both coarse and fine positioning adjustment capability. The fine positioning signals can position electron beam 26 to any accuracy of +/−4 microns. The sweep signals are used to scan each of the apertures with the scan pattern appropriate for the specific operation being performed. While the specific scans are a function of the selected aperture design, the types of scans include raster scans (three different sizes), horizontal line scans, vertical line scans, and ray burst scans. In all cases, the sweep signals are summed with the DC positioning voltages before being fed into deflection amplifier 94. Where appropriate, trigger pulses for start of scan are also provided.

Sensor input signals 144 being generated by electron beam 26 scanning the targets are processed as a function of the selected mode of operation by signal processing electronics 138. Signal processing includes amplification, filtering, and analog-to-digital conversion. Computational software 140, which may or may not be executing on CPU 24, is then used in adjusting dynamic focus driver 82, dynamic astigmatism correction generator 86, and geometric correction generator 84. Computational software 140 also permits calculation of the line frequency response (LFR) of the spot, which is a quantitative measure of the spot's size and shape.

Figure 8:
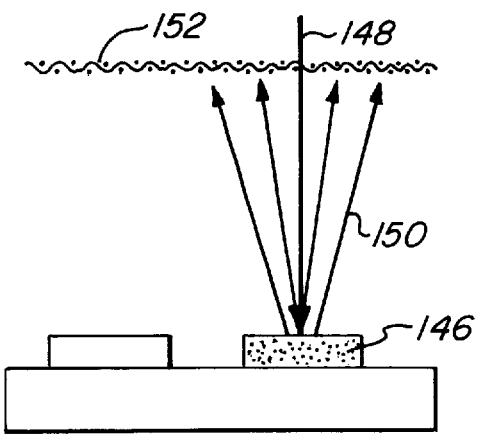
FIGS. 8 and 9 are end plan views illustrating the methodology used by the system of FIG. 1 to test printed circuit boards.
Figure 9:
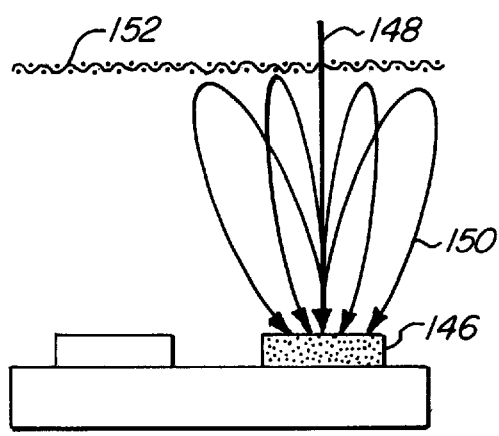

Referring now to FIGS. 8 and 9, the methodology used in testing a printed circuit board 62 is based upon the fact that a potential can be established on a surface 146 by striking that surface with electrons 148 in a particular energy range. That energy range is where the number of electrons 150 knocked off the surface (secondary electrons) by those electrons 148 striking the surface are more than the number of electrons 148 striking the surface. That energy range may be different for different materials, but generally fall within a predicable envelope. If a grid or mesh 152 is placed just above surface 146, and the electrons 148 striking the surface are in the range described above, then that surface 146 will acquire a potential applied to the grid. For example, if grid 152 is placed at a more positive potential than a reference potential of the surface (FIG. 8), when electrons 148 strike surface 146, essentially all of secondary electrons 150 will be attracted to grid 152, and surface 146 will acquire the positive potential of grid 152. For example, if the reference voltage is 0 volts, and the grid is placed at 20 volts, the surface will acquire the positive 20 volt potential. However, if grid 152 is placed at a more negative potential than a reference potential of the surface (FIG. 9), when electrons 148 strike surface 146, essentially all of secondary electrons 150 will be repelled by grid 152 back to surface 146, and surface 146 will acquire the negative potential of grid 152. For example, if the reference voltage is 0 volts, and the grid is placed at −20 volts, the surface will acquire the negative −20 volt potential. This process is referred to as grid stabilization.

Figure 10:
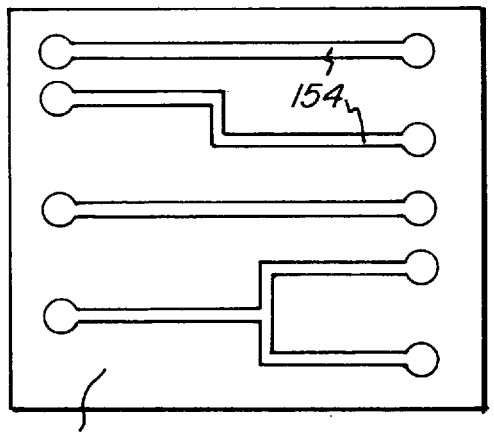
FIGS. 10–13 are top plan views of simple printed circuit boards which may be tested using the system of FIG. 1.
Figure 11:
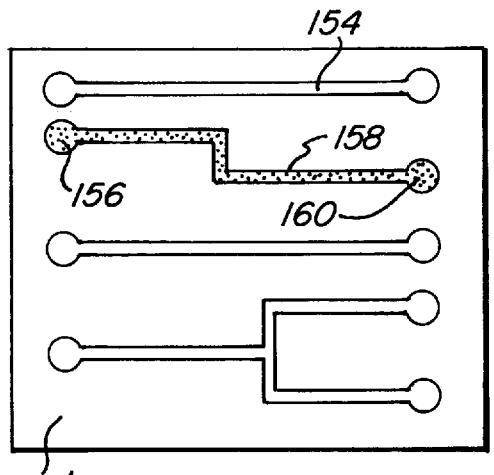
Figure 12:
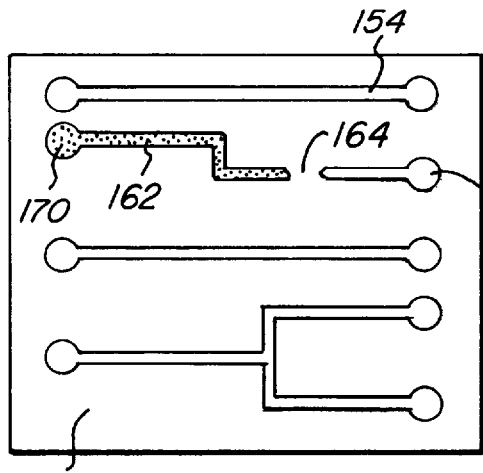
Figure 13:
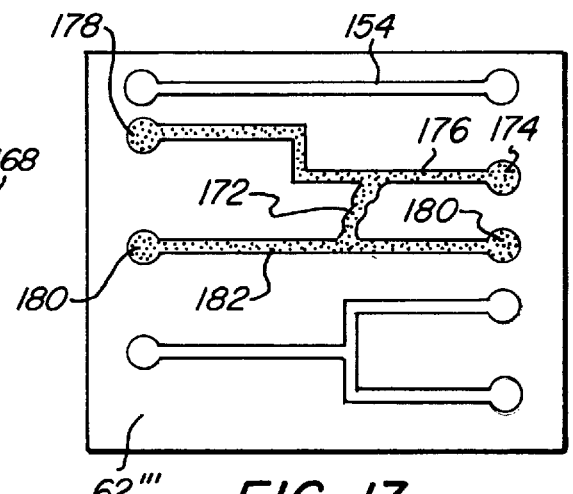

FIG. 10 illustrates a simple printed circuit board 62. Using the grid stabilization approach described above, one or more selected conductor traces 154 on board 62 can be "primed" from a reference voltage to a desired first potential. The time required to prime a trace is a function of the material of which the trace is made, the length and width of the trace, the distance between the trace and other traces, power planes and ground planes, and the amount of beam current in the beam striking the trace. Typically, however, the time required is on the order of milliseconds. Referring now to FIG. 11, when one end 156 of a trace 158 is primed on board 62' that has no shorts or opens, the following will occur: (i) the entire primed trace 158, from the primed end 156 to the unprimed end 160, will acquire the potential applied to grid 152, and (ii) no other traces 154 on board 62' that are not deliberately connected to the primed trace 158 will acquire the same potential. However, as illustrated in FIG. 12, if a particular trace 162 of board 62" has an open 164 in it, that is there is a break somewhere along trace 162, then the end 168 of trace 162 opposite the primed end 170 will not acquire the same (i.e., the grid) potential. Similarly, as illustrated in FIG. 13 if two (or more) traces have inadvertently been electrical connected (shown at 172), or shorted, then, in addition to the end 174 of primed trace 176 opposite the primed end 178 acquiring the grid potential, the non-primed trace 182 and both ends 180 of the non-primed trace 182 will also acquire the grid potential.

Figure 14:
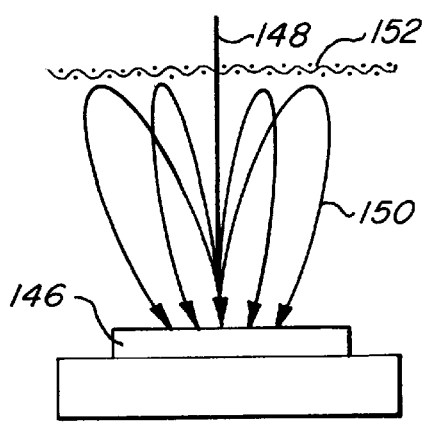
FIGS. 14 and 15 are end plan views illustrating the methodology used by the system of FIG. 1 to test printed circuit boards.
Figure 15:
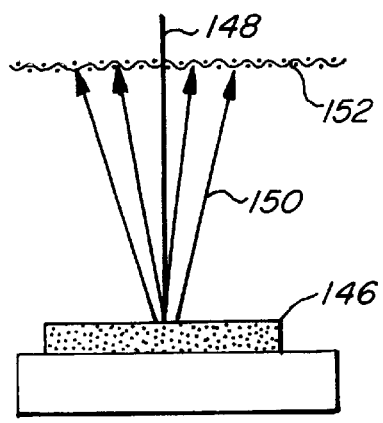

Being able to detect the voltage on the surface of a conductor trace, either at the other end of the trace that has been primed, or on adjacent traces, is essential to determining whether an open or a short exists. The detection process is accomplished by detecting the flow (or lack of flow) of secondary electrons (or current) in the grid above the circuit board. Referring now to FIGS. 14 and 15, grid 152 is placed at a potential which is between the potential of unprimed traces (i.e., the reference potential) and primed traces (i.e., the first grid potential). As illustrated in FIG. 14, if the potential on the surface of trace 146 being struck by primary beam 148 is more positive than the potential on grid 152, essentially none of secondary electrons 150 generated by primary beam 148 will be attracted to grid 152. On the other hand, as illustrated in FIG. 15, if the potential of the surface of the trace 146 being struck by primary beam 148 is more negative than grid 152, then essentially all of secondary electrons 150 generated by primary beam 148 will be attracted to grid 152.

Two illustrative examples follow, one using negative potentials with a 0 volt reference voltage and the other using positive potentials with a 0 volt reference voltage. It should be understood, however, that combinations of positive and negative potentials may also be used, and that the reference voltage may or may not be 0 volts, so long as the second grid potential (i.e., the interrogating potential) is between the reference potential and the first grid potential (i.e., the priming potential).

In the negative potential example, all traces are at a reference voltage of 0 volts. Grid 152 is placed at a first negative potential (e.g., −20 volts) and a trace is primed to that potential. Grid 152 is then placed at a second negative potential which is between the potential of unprimed traces (e.g., 0 volts) and primed traces (e.g., −20 volts). For example, grid 152 may be placed at −10 volts. The primary beam 148 is now used to interrogate various locations on traces on the board. If the interrogated location on the trace has been primed (i.e., is at −20 volts), secondary electrons will be collected by grid 152. If the interrogated location on the trace has not been primed (i.e., is at 0 volts), then secondary electrons will not be collected by grid 152. The presence or absence of collected secondary electrons can then be used to indicate shorts or opens. In the positive potential example, all traces are at a reference voltage of 0 volts. Grid 152 is placed at a first positive potential (e.g., 20 volts) and a trace is primed to that potential. Grid 152 is then placed at a second positive potential which is between the potential of unprimed traces (e.g., 0 volts) and primed traces (e.g., 20 volts). For example, grid 152 may be placed at 10 volts. The primary beam 148 is now used to interrogate various locations on traces on the board. If the interrogated location on the trace has been primed (i.e., is at 20 volts), secondary electrons will not be collected by grid 152. If the interrogated location on the trace has not been primed (i.e., is at 0 volts), then secondary electrons will be collected by grid 152. The presence or absence of collected secondary electrons can then be used to indicate shorts or opens. It should be noted from the above examples that in the negative potential example, the presence of collected secondary electrons indicates that the interrogated location has been primed, while in the positive potential example, the presence of collected secondary electrons indicates that the interrogated location has not been primed.

Voltage stabilization grid 152 is an electroformed mesh. The width and spacing of the conductors in this mesh are selected to minimize the interception of electron beam 26 by the conductors, to maximize the transmission of electron beam 26 through the mesh, and to insure that one or more conductors are always in proximity to every conductor trace on printed circuit board 62. In addition, the mesh material should be chemically inert and not readily oxidizable, should not generate magnetic fields that affect the position of electron beam 26, and should have a high tensile strength. Acceptable materials for grid 152 may include gold, copper, and nickel.

Based upon the principles and description of system 10 components presented above, a specific example of the operation of system 10 follows. In the case of the manual load system, test chamber 18 is first backfilled to atmospheric pressure. During the backfilling operation, electron gun chambers 34 are isolated by gun ball values 108 so that electron gun assemblies 12 remain under high vacuum. Test chamber 18 door is then opened and printed circuit board 62, or series of boards, to be tested is inserted into a support frame within test chamber 18. Positioned just above the two surfaces of printed circuit board 62 are grids 152. Once the door to test chamber 18 is closed, a pump-down sequence is initiated that establishes an operating level vacuum in test chamber 18. Because of the relatively low operating vacuum required, this pump-down process takes only between one and two minutes. Once the required vacuum level has been reached, gun ball valves 108 open and system 10 is ready to test printed circuit board 62.

Electron gun assemblies 12 are activated and two electron beams 26, under computer control by raster/vector generator 43, independently scan fiducial marks 184 (FIG. 16) on both sides of printed circuit board 62 about to be tested. Secondary electron signals extracted from fiducial marks 184 are used to either align printed circuit board 62 to the deflection axes of the electron optics, or more preferably, to align the deflection axes to printed circuit board 62. The latter approach allows the electron optics on each side of printed circuit board to be aligned independently of the other, which allows for compensation for situations where the traces on each side of the board are skewed relative to each other. Aligning the deflection axes of the electron optics to printed circuit board 62 can be accomplished by software executing on CPU 24.

Figure 16:
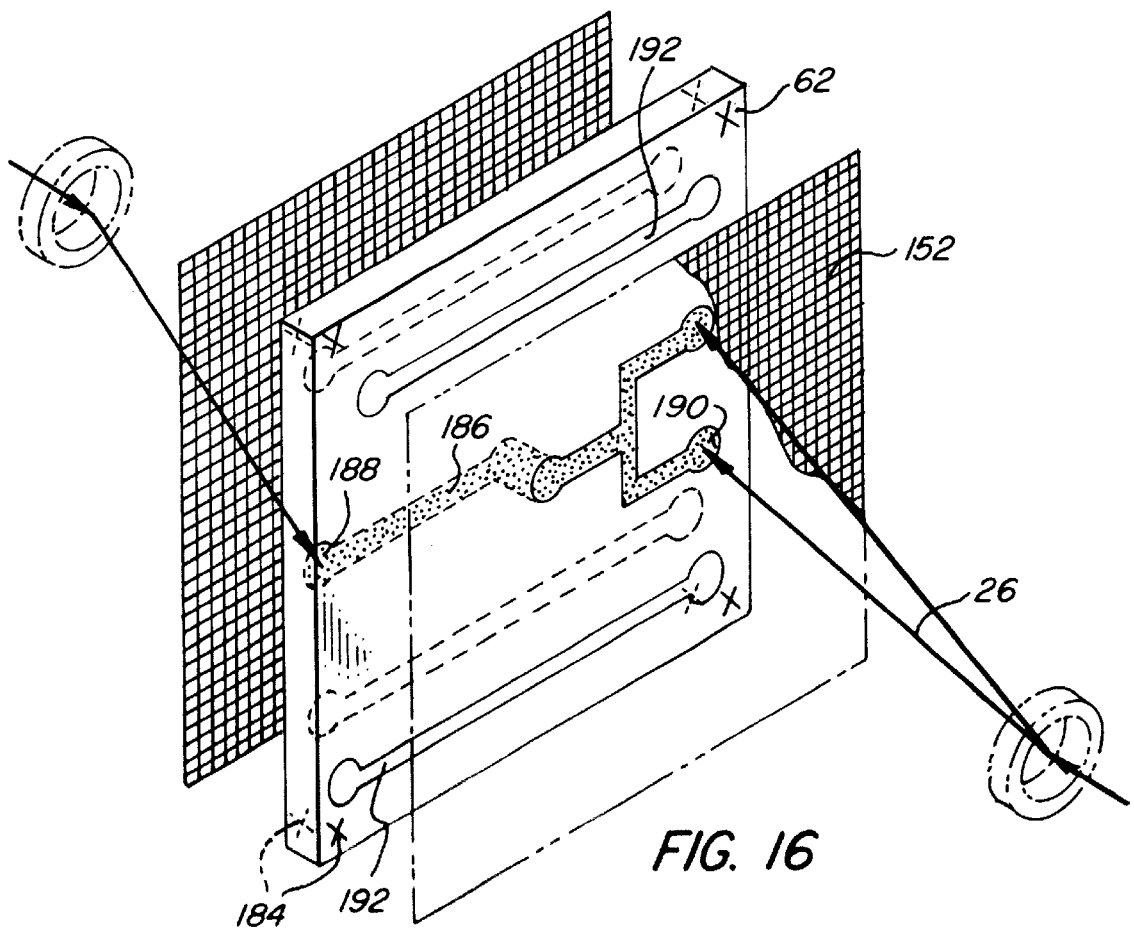
FIG. 16 is a side isometric view, partially cut away, illustrating a printed circuit board being tested using the system of FIG. 1.

Digital data used to manufacture the bare board contain the information necessary to position electron beam 26 to the required test points on printed circuit board 62. This data is loaded into CPU 24, which controls electron beams 26 during the testing operation. During testing, the positioning data is sent by CPU 24 to raster/vector generator 43. Referring now to FIG. 16, the testing sequence consists of first addressing one end of a conductor 186, setting the potential on the grid 152 above the conductor end 188 to be primed to the desired priming voltage, turning the electron beam 26 above the conductor end 188 to be primed on, and priming conductor 186 to that voltage. The voltage on grid 152 above a desired test end 190 on conductor 186 is then switched to the desired readout potential and test end 190 on conductor 186 is addressed, either by the same electron beam 26 performing the priming or by the electron beam 26 on the opposite side of printed circuit board 62 if test end 190 is on the opposite side as primed end 188 (as is the case shown in FIG. 16). The presence or absence of secondary electron current in grid 152 above test end 190 is used by CPU 24 with its interpretive software 196 to make a determination as to whether or not test end 190 has acquired the same potential as primed end 188. If it has, conductor 186 is continuous. If it has not, an open condition exists in conductor 186. Subsequently, adjacent conductors 192 are interrogated by electron beams 26 to determine if they have acquired the same potential (a short condition).

This testing sequence is repeated for all conductors on both sides of printed circuit board 62. During testing, the location and type of any defects (shorts or opens) detected by CPU 24 with its interpretive software 196 is stored in the CPU for later use. Upon completion of the testing, test chamber 18 is again backfilled to atmospheric pressure. As before, during the backfilling operation, electron gun chambers 34 are isolated by gun ball values 108 so that electron gun assemblies 12 remain under high vacuum. Test chamber 18 door is then opened and the board, or series of boards, that have been tested is removed.

The fully automatic system differs only in the way printed circuit boards are introduced into and removed from test chamber 18. The fully automatic system contains another chamber where a series of boards to be tested are initially loaded. This "holding" chamber is connected to the test chamber by way of a slit valve. With the slit valve closed, this chamber can be opened to atmosphere and a set of boards "stacked" inside. The door to this chamber is then closed and the air inside pumped out. Once the chamber has reached the required vacuum level, the slit valve is opened. A transport mechanism then moves the first board (or set of boards) into the test chamber. When testing of that board is completed, it is moved back into the holding chamber and a second board is moved into the test chamber. This process continues until all of the boards that were placed in the holding chamber have been tested. The slit valve is then closed, the holding chamber is brought back to atmospheric pressure, the tested boards removed and another set of boards to be tested are loaded. It should also be understood that multiple holding chambers may be provided, so that while one holding chamber is being used, the other holding chamber(s) may be loaded and unloaded.

The above-described design of system 10 thus allows testing and qualifying of printed circuit boards, or panels of printed circuit boards, up to 18" by 18" (324 sq. in.) in size without any movement of the boards themselves using an x-y table or the like. This is a significant improvement over the prior art, with testing of fixed circuit boards having dimensions greater than 4" by 4" (16 sq. in.) being heretofore unheard of. By not requiring mechanical movement of the boards, the time required for testing has been greatly reduced. In this regard, system 10 is capable of addressing any point on a printed circuit board up to 18" by 18" (324 sq. in.) in size in under 100 microseconds. Using two, computer controlled electron beams, all of the conductors on each side of a board, as well as all through board conductors, are rapidly addressed and interrogated. The computer subsequently analyzes the signals returned from the conductors and a determination is made as to their integrity. The presence and location of such defects as an open along a conductor and/or a short between adjacent conductors are readily and accurately identified using this system. Thus, with the system's electron beam control, correction, and addressing capability, large area circuit boards can be tested without any mechanical movement of the boards. Moreover, the dual electron beam approach permits testing conductors on both sides of a board "simultaneously," while also permitting testing of "through board" conductors, i.e. conductors that originate on one side of the board and terminate on the other side.

The present invention, therefore, provides a system for testing printed circuit boards which tests the networks of printed circuit boards without any physical contact therewith, which quickly tests numerous points on the boards, which can test large boards or panels of small boards without requiring movement of the boards, which tests networks passing through the boards, and which reliably detects the presence of emitted secondary electrons.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A system for testing for opens in and shorts between conductor traces on a surface of a printed circuit board, the conductor traces having a reference potential, said system comprising:

an electron gun assembly for generating an electron beam;

an electron optics assembly for directing the electron beam to the conductor traces on the surface of the printed circuit board;

a raster/vector generator for controlling position and intensity of the electron beam;

a grid located proximate to and substantially parallel with the surface of the printed circuit board, said grid capable of collecting secondary electrons emitted from the printed circuit board, said grid being placed at a first potential before the electron beam is directed to a first point on a conductor trace to charge the conductor trace to a first potential, and being placed at a second potential, the second potential being between the reference potential and the first potential, before the electron beam is directed to a second point on a conductor trace to cause emission of secondary electrons; and signal processing electronics and a CPU for determining whether or not an open or short exists depending on whether secondary electrons are collected by said grid as the electron beam is directed to various locations on the conductor traces on the surface of the printed circuit board.

2. The system of claim 1 wherein said electron optics assembly comprises:

a focus coil having static and dynamic windings to focus the electron beam anywhere across the surface of the printed circuit board;

at least one beam alignment yoke to position the electron beam precisely along the magnetic axis;

a deflection yoke to produce magnetic fields that precisely position the electron beam anywhere across the surface of the printed circuit board; and an astigmatism corrector to compensate for any residual astigmatism caused by said focus coil and for any deflection astigmatism caused by said deflection yoke.

3. The system of claim 2 further comprising a static focus control for controlling the static windings of said focus coil.

4. The system of claim 2 further comprising a dynamic focus driver for controlling the dynamic windings of said focus coil to adjust the focus of the electron beam for changes in focal length as the electron beam is deflected over the surface of the printed circuit board.

5. The system of claim 2 further comprising a dynamic astigmatism correction generator for controlling said astigmatism corrector to correct for spot distortions as the electron beam is deflected away from a center of the printed circuit board.

6. The system of claim 2 further comprising a geometric correction generator for controlling said deflection yoke to correct for geometric distortions as the electron beam is deflected away from a center of the printed circuit board.

7. The system of claim 1 wherein the reference potential is substantially 0 volts, wherein the first potential comprises a first negative potential, and wherein the second potential comprises a second negative potential more positive than the first negative potential.

8. The system of claim 1 wherein the reference potential is substantially 0 volts, wherein the first potential comprises a first positive potential, and wherein the second potential comprises a second positive potential more negative than the first positive potential.

9. The system of claim 1 wherein said electron gun assembly is surrounded by a gun chamber, said electron optics assembly is surrounded by an electron optics chamber, and said printed circuit board is surrounded by a test chamber, and further comprising a vacuum system which creates a vacuum in the test chamber, which creates a vacuum in the electron optics chamber greater than the vacuum in the test chamber, and which creates a vacuum in the gun chamber greater than the vacuum in the electron optics chamber.

10. The system of claim 1 further comprising a spot analyzer for adjusting focus, astigmatism and geometry of the electron beam, and for measuring a spot size of the electron beam.

11. The system of claim 10 wherein said spot analyzer comprises:

a target plate having a plurality of polygonal apertures on a face thereof;

a plurality of sensors positioned inside said target plate under the plurality of polygonal apertures, said plurality of sensors generating signals indicative of the quality of an electron beam striking the polygonal aperture over which each sensor is positioned, beam control signals for directing the electron beam to strike the plurality of apertures on the face of said target plate;

signal processing electronics for amplifying, filtering and performing analog-to-digital conversion on the signals generated by said plurality of sensors thereby generating processed signals; and computational software executing on said CPU for adjusting said electron optics assembly based on the processed signals.

12. The system of claim 1 wherein the surface of the printed circuit board includes at least two fiducial marks thereon and further comprising software executing on said CPU for aligning a deflection axes of said electron optics assembly with respect to the surface of the printed circuit board based upon secondary electron signals generated by said at least two fiducial marks when struck by the electron beam.

13. The system of claim 1 wherein the system is capable of addressing, with the electron beam, the entire surface of a printed circuit board having an area greater than 16 square inches while the printed circuit board is maintained in a stationary position with respect to the electron gun assembly.

14. The system of claim 1 wherein the system is capable of addressing, with the electron beam, the entire surface of a printed circuit board having an area greater than 36 square inches while the printed circuit board is maintained in a stationary position with respect to the electron gun assembly.

15. The system of claim 1 wherein the system is capable of addressing, with the electron beam, any point on the surface of a printed circuit board having an area greater than 16 square inches in less than 100 microseconds.

16. The system of claim 1 wherein the system is capable of addressing, with the electron beam, any point on the surface of a printed circuit board having an area greater than 36 square inches in less than 100 microseconds.

17. A system for testing for opens in and shorts between conductor traces on two surfaces of a printed circuit board, the conductor traces having a reference potential, said system comprising:

two electron gun assemblies for generating two electron beams;

two electron optics assemblies, one of said electron optics assemblies for directing one of said electron beams to the conductor traces on one of the surfaces of the printed circuit board, and the other of said electron optics assemblies for directing the other of said electron beams to the conductor traces on the other of the surfaces of the printed circuit board;

a raster/vector generator for controlling position and intensity of the electron beams;

two grids, each of said grids located proximate to and substantially parallel with one of the surfaces of the printed circuit board, said grids capable of collecting secondary electrons emitted from the printed circuit board, at least one of said grids being placed at a first potential before one of the electron beams is directed to a first point on a conductor trace to charge the conductor trace to a first potential, and at least one of said grids being placed at a second potential, the second potential being between the reference potential and the first potential, before one of the electron beams is directed to a second point on a conductor trace to cause emission of secondary electrons; and signal processing electronics and a CPU for determining whether or not an open or short exists depending on whether secondary electrons are collected by said grids as the electron beams are directed to various locations on the conductor traces on the surfaces of the printed circuit board.

18. The system of claim 17 wherein each of said electron optics assemblies comprises:

a focus coil having static and dynamic windings to focus each electron beam anywhere across the surface of the printed circuit board;

at least one beam alignment yoke to position each electron beam precisely along the magnetic axis;

a deflection yoke to produce magnetic fields to precisely position each electron beam anywhere across the surfaces of the printed circuit board; and an astigmatism corrector to compensate for any residual astigmatism caused by said focus coil and for any deflection astigmatism caused by said deflection yoke.

19. The system of claim 18 further comprising a static focus control for controlling the static windings of said focus coils.

20. The system of claim 18 further comprising a dynamic focus driver for controlling the dynamic windings of said focus coils to adjust the focus of the electron beams for changes in focal length as the electron beams are deflected over the surfaces of the printed circuit board.

21. The system of claim 18 further comprising a dynamic astigmatism correction generator for controlling said astigmatism correctors to correct for spot distortions as the electron beams are deflected away from a center of the printed circuit board.

22. The system of claim 18 further comprising a geometric correction generator for controlling said deflection yokes to correct for geometric distortions as the electron beams are deflected away from a center of the printed circuit board.

23. The system of claim 17 wherein the reference potential is substantially 0 volts, wherein the first potential comprises a first negative potential, and wherein the second potential comprises a second negative potential more positive than the first negative potential.

24. The system of claim 17 wherein the reference potential is substantially 0 volts, wherein the first potential comprises a first positive potential, and wherein the second potential comprises a second positive potential more negative than the first positive potential.

25. The system of claim 17 wherein said electron gun assemblies are surrounded by gun chambers, said electron optics assemblies are surrounded by electron optics chambers, and said printed circuit board is surrounded by a test chamber, and further comprising a vacuum system which creates a vacuum in the test chamber, which creates vacuums in the electron optics chambers greater than the vacuum in the test chamber, and which creates vacuums in the gun chambers greater than the vacuums in the electron optics chambers.

26. The system of claim 17 further comprising a spot analyzer for adjusting focus, astigmatism and geometry of the electron beams, and for measuring spot sizes of the electron beams.

27. The system of claim 26 wherein said spot analyzer comprises:

a target plate having two opposing faces and a plurality of polygonal apertures on each face of said target plate;

a plurality of sensors positioned inside said target place under the plurality of polygonal apertures, said plurality of sensors generating first signals indicative of the quality of a first electron beam striking the apertures on one face of the target plate and second signals indicative of the quality of a second electron beam striking the apertures on the other face of the target plate;

beam control signals for directing the electron beams to strike the plurality of apertures on each face of said target plate;

signal processing electronics for amplifying, filtering and performing analog-to-digital conversion of the first signals and the second signals thereby generating first processed signals and second processed signals; and computational software executing on a CPU for adjusting one of the electron optics assemblies based on the first processed signals and for adjusting the other one of the electron optics assemblies based on the second processed signals.

28. The system of claim 17 wherein each surface of the printed circuit board includes at least two fiducial marks thereon and further comprising software executing on said CPU for aligning the deflection axes of one of the electron optics assemblies with respect to a first surface of the printed circuit board based upon secondary electron signals generated by said at least two fiducial marks on the first surface of the printed circuit board when struck by one of the electron beams, and for aligning the deflection axes of the other one of the electron optics assemblies with respect to a second surface of the printed circuit board based upon secondary electron signals generated by said at least two fiducial marks on the second surface of the printed circuit board when struck by the other one of the electron beams.

29. The system of claim 17 wherein the system is capable of addressing, with the electron beams, the entire surfaces of a printed circuit board having an area greater than 16 square inches while the printed circuit board is maintained in a stationary position with respect to the electron gun assemblies.

30. The system of claim 17 wherein the system is capable of addressing, with the electron beams, the entire surfaces of a printed circuit board having an area greater than 36 square inches while the printed circuit board is maintained in a stationary position with respect to the electron gun assemblies.

31. The system of claim 17 wherein the system is capable of addressing, with the electron beams, any point on the surfaces of a printed circuit board having an area greater than 16 square inches in less than 100 microseconds.

32. The system of claim 17 wherein the system is capable of addressing, with the electron beams, any point on the surfaces of a printed circuit board having an area greater than 36 square inches in less than 100 microseconds.

33. A method for the contactless testing for opens in a conductor trace passing through a printed circuit board from a first surface to a second surface, the conductor trace having a reference potential, said method comprising the steps of placing a first grid located proximate to and substantially parallel with the first surface of the printed circuit board to a first potential;

directing a first electron beam to a first point on the conductor trace on the first surface to charge the conductor trace to substantially the first potential;

placing a second grid located proximate to and substantially parallel with the second surface of the printed circuit board to a second potential, the second potential being between the reference potential and the first potential;

directing a second electron beam to a second point on the conductor trace on the second surface to cause emission of secondary electrons; and determining whether an open exists depending on whether secondary electrons are collected by the second grid.

34. The method of claim 33 wherein the reference potential is substantially 0 volts, wherein said placing a first grid step comprises the step of placing a first grid located proximate to and substantially parallel with the first surface of the printed circuit board to a first negative potential, and wherein said placing a second grid step comprises the step of placing a second grid located proximate to and substantially parallel with the second surface of the printed circuit board to a second negative potential, the second negative potential being more positive than the first negative potential.

35. The method of claim 34 wherein said determining step comprises the steps of:

determining that no open exists between the first point and the second point if secondary electrons are collected by the second grid; and, determining that an open exists between the first point and the second point if secondary electrons are not collected by the second grid.

36. The method of claim 33 wherein the reference potential is substantially 0 volts, wherein said placing a first grid step comprises the step of placing a first grid located proximate to and substantially parallel with the first surface of the printed circuit board to a first positive potential, and wherein said placing a second grid step comprises the step of placing a second grid located proximate to and substantially parallel with the second surface of the printed circuit board to a second positive potential, the second positive potential being more negative than the first positive potential.

37. The method of claim 36 wherein said determining step comprises the steps of:

determining that an open exists between the first point and the second point if secondary electrons are collected by the second grid; and, determining that no open exists between the first point and the second point if secondary electrons are not collected by the second grid.

38. The method of claim 33 wherein each of said directing steps comprise:

focusing the electron beam anywhere across the surface of the printed circuit board with a focus coil having static and dynamic windings;

positioning the electron beam precisely along the magnetic axis with at least one beam alignment yoke;

producing magnetic fields to precisely position the electron beam on the surface of the printed circuit board with a deflection yoke; and compensating for any residual astigmatism caused by the focus coil and for any deflection astigmatism caused by the deflection yoke with an astigmatism corrector.

39. The method of claim 38 further comprising the step of controlling the static windings of the focus coil with a static focus control.

40. The method of claim 38 further comprising the step of controlling the dynamic windings of the focus coil to adjust the focus of the electron beam for changes in focal length as the electron beam is deflected over the surface of the printed circuit board with a dynamic focus driver.

41. The method of claim 38 further comprising the step of controlling the astigmatism corrector to correct for spot distortions as the electron beam is deflected away from a center of the printed circuit board with a dynamic astigmatism correction generator.

42. The method of claim 30 further comprising the step of controlling the deflection yoke to correct for geometric distortions as the electron beam is deflected away from a center of the printed circuit board with a geometric correction generator.

43. The method of claim 33 further comprising the step of controlling position and intensity of the electron beam with a raster/vector generator.

44. The method of claim 33 wherein the electron beams are generated by electron gun assemblies surrounded by gun chambers, wherein the electron beams are directed by electron optics assemblies surrounded by electron optics chambers, wherein the printed circuit board is surrounded by a test chamber, and further comprising the steps of:

creating a vacuum in the test chamber;

creating vacuums in the electron optics chambers greater than the vacuum in the test chamber; and creating vacuums in the gun chambers greater than the vacuums in the electron optics chambers.

45. The method of claim 33 further comprising the step of adjusting focus, astigmatism and geometry of the electron beams, and measuring a spot size of the electron beams, with a spot analyzer.

46. The method of claim 45 wherein said adjusting and measuring step comprises:

providing a target plate having a plurality of polygonal apertures faces thereof;

providing a plurality of sensors positioned inside the target plate under the plurality of polygonal apertures;

directing the electron beams to strike the plurality of apertures;

generating signals indicative of the quality of the electron beams striking the polygonal apertures;

amplifying, filtering and performing analog-to-digital conversion on the signals to generate processed signals; and adjusting electron optics assemblies used to direct the electron beams based on the processed signals.

47. The method of claim 33 wherein each surface of the printed circuit board includes at least two fiducial marks thereon and further comprising the step of aligning a deflection axis of each of two electron optics assemblies, used to direct the electron beams, with respect to the surfaces of the printed circuit board based upon secondary electron signals generated by the at least two fiducial marks.

48. The method of claim 33 further comprising the step of holding the printed circuit board in a stationary position and wherein the system is capable of addressing, with the electron beams, the entire surfaces of a printed circuit board having an area greater than 16 square inches.

49. The system of claim 33 further comprising the step of holding the printed circuit board in a stationary position and wherein the system is capable of addressing, with the electron beams, the entire surfaces of a printed circuit board having an area greater than 36 square inches.

50. The system of claim 33 wherein the printed circuit board has an area greater than 16 square inches, and wherein said directing steps require less than 100 microseconds.

51. The system of claim 33 wherein the printed circuit board has an area greater than 36 square inches, and wherein said directing steps require less than 100 microseconds.

52. A method for the contactless testing for shorts between conductor traces passing through a printed circuit board from a first surface to a second surface, the conductor traces having a reference potential, said method comprising the steps of:

placing a first grid located proximate to and substantially parallel with the first surface of the printed circuit board to a first potential;

directing a first electron beam to a point on a first conductor trace on the first surface to charge the first conductor trace to substantially the first potential;

placing a second grid located proximate to and substantially parallel with the second surface of the printed circuit board to a second potential, the second potential being between the reference potential and the first potential;

directing a second electron beam to a point on a second conductor trace on the second surface to cause emission of secondary electrons; and determining whether a short exists depending on whether secondary electrons are collected by the second grid.

53. The method of claim 52 wherein the reference potential is substantially 0 volts, wherein said placing a first grid step comprises the step of placing a first grid located proximate to and substantially parallel with the first surface of the printed circuit board to a first negative potential, and wherein said placing a second grid step comprises the step of placing a second grid located proximate to and substantially parallel with the second surface of the printed circuit board to a second negative potential, the second negative potential being more positive than the first negative potential.

54. The method of claim 53 wherein said determining step comprises the steps of:

determining that a short exists between the first conductor trace and the second conductor trace if secondary electrons are collected by the second grid; and, determining that no short exists between the first conductor trace and the second conductor trace if secondary electrons are not collected by the second grid.

55. The method of claim 52 wherein the reference potential is substantially 0 volts, wherein said placing a first grid step comprises the step of placing a first grid located proximate to and substantially parallel with the first surface of the printed circuit board to a first positive potential, and wherein said placing a second grid step comprises the step of placing a second grid located proximate to and substantially parallel with the second surface of the printed circuit board to a second positive potential, the second positive potential being more negative than the first positive potential.

56. The method of claim 55 wherein said determining step comprises the steps of:

determining that no short exists between the first conductor trace and the second conductor trace if secondary electrons are collected by the second grid; and, determining that a short exists between the first conductor trace and the second conductor trace if secondary electrons are not collected by the second grid.

57. The method of claim 52 wherein each of said directing steps comprise:

focusing the electron beam anywhere across the surface of the printed circuit board with a focus coil having static and dynamic windings;

positioning the electron beam precisely along the magnetic axis with at least one beam alignment yoke;

producing magnetic fields to precisely position the electron beam on the surface of the printed circuit board with a deflection yoke; and compensating for any residual astigmatism caused by the focus coil and for any deflection astigmatism caused by the deflection yoke with an astigmatism corrector.

58. The method of claim 57 further comprising the step of controlling the static windings of the focus coil with a static focus control.

59. The method of claim 57 further comprising the step of controlling the dynamic windings of the focus coil to adjust the focus of the electron beam for changes in focal length as the electron beam is deflected over the surface of the printed circuit board with a dynamic focus driver.

60. The method of claim 57 further comprising the step of controlling the astigmatism corrector to correct for spot distortions as the electron beam is deflected away from a center of the printed circuit board with a dynamic astigmatism correction generator.

61. The method of claim 57 further comprising the step of controlling the deflection yoke to correct for geometric distortions as the electron beam is deflected away from a center of the printed circuit board with a geometric correction generator.

62. The method of claim 52 further comprising the step of controlling position and intensity of the electron beam with a raster/vector generator.

63. The method of claim 52 wherein the electron beams are generated by electron gun assemblies surrounded by gun chambers, wherein the electron beams are directed by electron optics assemblies surrounded by electron optics chambers, wherein the printed circuit board is surrounded by a test chamber, and further comprising the steps of:

creating a vacuum in the test chamber;

creating vacuums in the electron optics chambers greater than the vacuum in the test chamber; and creating vacuums in the gun chambers greater than the vacuums in the electron optics chambers.

64. The method of claim 52 further comprising the step of adjusting focus, astigmatism and geometry of the electron beams, and measuring a spot size of the electron beams, with a spot analyzer.

65. The method of claim 64 wherein said adjusting and measuring step comprises:

providing a target plate having a plurality of polygonal apertures faces thereof;

providing a plurality of sensors positioned inside the target plate under the plurality of polygonal apertures;

directing the electron beams to strike the plurality of apertures;

generating signals indicative of the quality of the electron beams striking the polygonal apertures;

amplifying, filtering and performing analog-to-digital conversion on the signals to generate processed signals; and adjusting electron optics assemblies used to direct the electron beams based on the processed signals.

66. The method of claim 52 wherein each surface of the printed circuit board includes at least two fiducial marks thereon and further comprising the step of aligning a deflection axis of each of two electron optics assemblies, used to direct the electron beams, with respect to the surfaces of the printed circuit board based upon secondary electron signals generated by the at least two fiducial marks.

67. The method of claim 52 further comprising the step of holding the printed circuit board in a stationary position and wherein the system is capable of addressing, with the electron beams, the entire surfaces of a printed circuit board having an area greater than 16 square inches.

68. The system of claim 52 further comprising the step of holding the printed circuit board in a stationary position and wherein the system is capable of addressing, with the electron beams, the entire surfaces of a printed circuit board having an area greater than 36 square inches.

69. The system of claim 52 wherein the printed circuit board has an area greater than 16 square inches, and wherein said directing steps require less than 100 microseconds.

70. The system of claim 52 wherein the printed circuit board has an area greater than 36 square inches, and wherein said directing steps require less than 100 microseconds.

* * * * *